United States Patent
Hiwatari et al.

(10) Patent No.: US 8,937,122 B2
(45) Date of Patent: Jan. 20, 2015

(54) COMPOUND HAVING HINDERED AMINE BACKBONE, AND RESIN COMPOSITION

(75) Inventors: Ken-ichiro Hiwatari, Tokyo (JP); Tomoaki Saiki, Tokyo (JP)

(73) Assignee: Adeka Coporation, Tokyo (JP)

( * ) Notice: Subject to any disclaimer, the term of this patent is extended or adjusted under 35 U.S.C. 154(b) by 149 days.

(21) Appl. No.: 13/518,170

(22) PCT Filed: Nov. 15, 2011

(86) PCT No.: PCT/JP2011/076276
§ 371 (c)(1),
(2), (4) Date: Jun. 21, 2012

(87) PCT Pub. No.: WO2012/105103
PCT Pub. Date: Aug. 9, 2012

(65) Prior Publication Data
US 2013/0018132 A1    Jan. 17, 2013

(30) Foreign Application Priority Data

Feb. 4, 2011    (JP) .................................. 2011-022847
Jun. 28, 2011    (JP) .................................. 2011-142749

(51) Int. Cl.
| | | |
|---|---|---|
| *C08K 5/34* | (2006.01) | |
| *C08G 77/388* | (2006.01) | |
| *C08G 77/12* | (2006.01) | |
| *C09J 183/14* | (2006.01) | |
| *C08G 77/50* | (2006.01) | |
| *C08G 77/00* | (2006.01) | |

(52) U.S. Cl.
CPC .............. *C08G 77/388* (2013.01); *C08G 77/12* (2013.01); *C09J 183/14* (2013.01); *C08G 77/50* (2013.01); *C08G 77/80* (2013.01)
USPC ............. 524/99; 524/102; 524/430; 524/432; 528/28; 546/14

(58) Field of Classification Search
CPC .... C08K 3/22; C08K 3/0033; A63B 37/0003; B82Y 30/00; C08G 77/06; C08G 77/08; C08G 77/16; C08G 77/20; C08G 77/388; C08G 77/12; C08G 77/50; C09J 183/14
USPC .......... 524/99, 102, 430, 432; 528/28; 546/14
See application file for complete search history.

(56) References Cited

U.S. PATENT DOCUMENTS

| | | | | |
|---|---|---|---|---|
| 5,514,738 | A * | 5/1996 | Borzatta et al. ................ | 524/102 |
| 5,561,179 | A | 10/1996 | Borzatta et al. | |
| 7,985,806 | B2 | 7/2011 | Shiobara | |
| 8,003,736 | B2 | 8/2011 | Sueyoshi et al. | |
| 8,470,937 | B2 | 6/2013 | Hiwatari et al. | |
| 2005/0020738 | A1 | 1/2005 | Jackson et al. | |
| 2009/0203822 | A1 | 8/2009 | Shiobara | |
| 2011/0020249 | A1 | 1/2011 | Lorentz et al. | |

FOREIGN PATENT DOCUMENTS

| | | |
|---|---|---|
| CN | 101538367 A | 9/2009 |
| CN | 101921456 A | 12/2010 |
| EP | 2141188 | 1/2010 |
| EP | 2599836 | 6/2013 |
| GB | 2295619 A | 5/1996 |
| JP | 3-006273 | 1/1991 |
| JP | 4-247091 | 9/1992 |
| JP | 4-305584 | 10/1992 |
| JP | 5-132580 | 5/1993 |
| JP | 8-225651 | 9/1996 |
| JP | 11-293050 | 10/1999 |
| WO | WO 2009/047212 | 4/2009 |

OTHER PUBLICATIONS

International Search Report, PCT/JP2011/076276, Jan. 31, 2012.

\* cited by examiner

*Primary Examiner* — Kriellion Sanders
(74) *Attorney, Agent, or Firm* — Young & Thompson

(57) ABSTRACT

A compound has excellent thermal resistance and compatibility with resins, improves thermal resistance of resins, and specifically provides a compound represented by the following general formula (1). In formula (1), $R^1$ to $R^4$ each represent a C1-12 alkyl group or a C6-12 aryl group, y represents a number 1-2,000, and $X^1$ represents a group represented by the formula (2) or (3). In formula (2), $R^5$ represents a hydrogen atom, O., a C1-12 alkyl group or a C1-12 alkoxy group, $L^1$ represents a C1-6 alkylene group or a C6-12 arylene group. In formula (3), $R^6$ represents a C1-4 alkyl group or a C6-12 aryl group, $X^2$ represents a group represented by the formula (2) or a hydrogen atom, s represents a number 2-6, $L^2$ represents a C1-6 alkylene group or a C6-12 arylene group, and at least one of s number of $X^2$s is the group represented by the formula (2).

19 Claims, No Drawings

COMPOUND HAVING HINDERED AMINE BACKBONE, AND RESIN COMPOSITION

TECHNICAL FIELD

The present invention relates to a novel compound having a hindered amine backbone, and to a resin composition containing said compound. The compound of the present invention is useful as a stabilizer that can impart thermal resistance to resins, and the resin composition of the present invention is excellent in thermal resistance.

BACKGROUND ART

Since SiC (silicon carbide) power semiconductors have smaller energy loss during energization, smaller amount of heat generation and higher thermal resistance than those of silicon power semiconductors that are widely used at present, they can handle larger electrical power, and are considered actively now. A silicon power semiconductor device has a thermal resistance limit temperature of about 150° C., whereas use of an SiC power semiconductor device at from 200 to 300° C. is considered, and further thermal resistance is also required for a resin to be used for an SiC power semiconductor, and additives to be used for said resin.

Resins that are used as sealing materials and insulation materials for silicon power semiconductor devices had a problem that deterioration is caused when they are used for a long term at a temperature higher than 200° C., and sealing property and electrical insulating property are decreased.

Various additives have been conventionally used so as to prevent deterioration of resins and to maintain performances for a long term. One of such additives is a hindered amine light stabilizer (HALS) having a 2,2,6,6-tetramethylpiperidine backbone, and for example, an HALS having a structure that is excellent in thermal resistance in the case when processing and molding are conducted in a short process such as melt injection molding, and an HALS that is excellent in long-term weather resistance for use in outdoor exposure have been reported (see, for example, Patent Literature 1).

However, in the case when the above-mentioned HALSs are exposed to a condition at higher than 200° C. for a long term, the HALSs themselves are decomposed and cannot maintain performances as a stabilizer for a long term, which consequently leads to insufficient thermal resistance of resins. Furthermore, as an HALS having a high molecular weight, an HALS having a polysiloxane structure obtained by polymerizing a siloxane monomer having a hindered amine backbone is also known (see, for example, Patent Literature 2). Since conventionally-known HALSs having a siloxane structure generally have high polarity and insufficient compatibility with resins, when they were used for a long term, bleeding occurred easily, and thus they were difficult to be used in some uses.

CITATION LIST

Patent Literatures

Patent Literature 1: Japanese Patent Application Laid-Open (JP-A) No. 5-132580
Patent Literature 2: JP-A No. 11-293050

SUMMARY OF INVENTION

Technical Problem

Therefore, the problem of the present invention is to provide a compound that is excellent in thermal resistance and compatibility with resins, and can sufficiently improve the thermal resistance of the resins.

Solution to Problem

The present inventors have done intensive studies in view of the above-mentioned problem, and consequently found that a compound in which hindered amine backbones are introduced into the terminals of a polysiloxane is excellent in thermal resistance and compatibility with resins, and can improve the thermal resistance of the resins.

The present invention has been made based on the above-mentioned finding, and provides a compound represented by the following general formula (1), and a resin composition containing said compound by from 0.001 to 10 parts by mass with respect to 100 parts by mass of the resin.

[Chemical Formula 1]

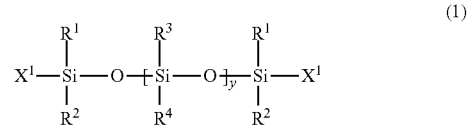

wherein $R^1$ to $R^4$ each represent a straight chain or branched alkyl group having 1 to 12 carbon atoms or an aryl group having 6 to 12 carbon atoms, y represents a number of from 1 to 2,000, $X^1$ represents a group represented by the following general formula (2) or a group represented by the following general formula (3),

[Chemical Formula 2]

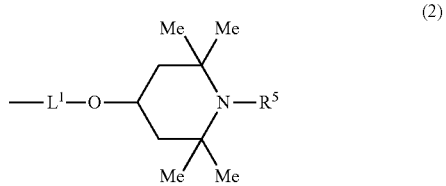

wherein $R^5$ represents a hydrogen atom, O., a straight chain or branched alkyl group having 1 to 12 carbon atoms or a straight chain or branched alkoxy group having 1 to 12 carbon atoms, $L^1$ represents a straight chain or branched alkylene group having 1 to 6 carbon atoms or an arylene group having 6 to 12 carbon atoms, and O. represents an oxyradical,

[Chemical Formula 3]

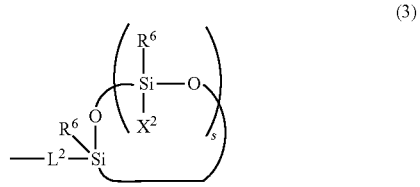

wherein $R^6$ represents an alkyl group having 1 to 4 carbon atoms or an aryl group having 6 to 12 carbon atoms, $X^2$ represents a group represented by the general formula (2) or a hydrogen atom, s represents a number of 2 to 6, $L^2$ represents a straight chain or branched alkylene group having 1 to 6 carbon atoms or an arylene group having 6 to 12 carbon atoms, provided that at least one of s number of $X^2$s is a group represented by the general formula (2).

Advantageous Effects of Invention

According to the present invention, a compound that is excellent in thermal resistance and compatibility with resins and sufficiently improves the thermal resistance of the resins can be provided.

DESCRIPTION OF EMBODIMENTS

The preferable exemplary embodiments of the compound represented by the general formula (1) of the present invention will be explained.

$R^1$ to $R^4$ each represent a straight chain or branched alkyl group having 1 to 12 carbon atoms or an aryl group having 6 to 12 carbon atoms.

Examples of the above-mentioned alkyl group may include a methyl group, an ethyl group, a propyl group, an isopropyl group, a butyl group, an isobutyl group, a secondary butyl group, a tertiary butyl group, a pentyl group, an amyl group, an isoamyl group, a hexyl group, a heptyl group, an isoheptyl group, an octyl group, an isooctyl group, a 2-ethylhexyl group, a nonyl group, an isononyl group, a decyl group, a dodecyl group and the like.

Examples of the above-mentioned aryl group may include a phenyl group, a naphthyl group, a 2-methylphenyl group, a 3-methylphenyl group, a 4-methylphenyl group, a 4-vinylphenyl group, a 3-isopropylphenyl group, a 4-isopropylphenyl group, a 4-butylphenyl group, a 4-isobutylphenyl group, a 4-tertiary butylphenyl group, a 4-hexylphenyl group, a 4-cyclohexylphenyl group and the like.

$R^1$ to $R^4$ are each preferably an alkyl group having 1 to 6 carbon atoms or an aryl group having 6 to 10 carbon atoms, more preferably a methyl group, an ethyl group or a phenyl group, and further preferably a methyl group or a phenyl group because of specifically excellent compatibility with resins.

Furthermore, $R^1$, $R^2$, $R^3$ and $R^4$ in the general formula (1) may be the same or different with each other. Moreover, $R^1$s that exist plurally in the general formula (1) may be the same or different with each other in the same molecule, which also applies to $R^2$, $R^3$ and $R^4$. In order to synthesize a compound in which two or more kinds of substituents are mixed as $R^1$ to $R^4$, it is only necessary to, for example, use a plurality of monomers as raw materials and polymerize them.

It is preferable that $R^1$ and $R^2$ are identical substituents in the same molecule.

$R^3$s in the general formula (1) are preferably two or more kinds of substituents in the same molecule (provided that y is 2 or more), and more preferably mixing of one or more kinds of aryl groups and one or more kinds of alkyl groups. $R^4$ is similar to $R^3$.

The content of the aryl group is preferably from 5 to 35 mol %, more preferably from 5 to 30 mol %, and further preferably from 10 to 30 mol % in the total of the aryl group and alkyl group represented by $R^1$ to $R^4$ in the same molecule since the compound has higher thermal resistance.

y in the general formula (1) represents a number of from 1 to 2,000, and preferably from 20 to 1,000.

$X^1$ in the general formula (1) represents a group represented by the above-mentioned general formula (2) or general formula (3), and the group represented by the above-mentioned general formula (2) is preferable since the compound represented by the general formula (1) has finer thermal stability.

Firstly, the general formula (2) will be explained.

$R^5$ represents a hydrogen atom, O., a straight chain or branched alkyl group having 1 to 12 carbon atoms or a straight chain or branched alkoxy group having 1 to 12 carbon atoms, and $L^1$ is a straight chain or branched alkylene group having 1 to 6 carbon atoms or an arylene group having 6 to 12 carbon atoms. O. represents an oxyradical.

Examples of the above-mentioned alkyl group may include those exemplified as alkyl groups represented by $R^1$ to $R^4$ in the general formula (1). Examples of the above-mentioned alkoxy group may include alkoxy groups such as a methoxy group, a methoxymethoxy group, a methoxyethoxymethoxy group, a methylthiomethoxy group, an ethoxy group, a vinyloxy group, a propoxy group, an isopropoxy group, a butoxy group, an isobutoxy group, a tertiary butoxy group, a tertiary butyldimethylsilyloxy group, a tertiary butoxycarbonylmethoxy group, a pentyloxy group, an isopentyloxy group, a tertiary pentyloxy group, a neopentyloxy group, a hexyloxy group, a cyclohexyloxy group, an isohexyloxy group, a heptyloxy group, an octyloxy group, a 2-ethylhexyloxy group, a nonyloxy group, a decyloxy group, an undecyloxy group and a dodecyloxy group.

Since the thermal resistance of a resin to which the compound of the present invention has been added is improved more, $R^3$ is preferably a hydrogen atom, an alkyl group having 1 to 6 carbon atoms or an alkoxy group having 1 to 12 carbon atoms, more preferably a hydrogen atom, an alkyl group having 1 or 2 carbon atoms or an alkoxy group having 1 to 12 carbon atoms, further preferably a hydrogen atom or a methyl group, and the most preferably a methyl group for easiness of synthesis.

$L^1$ in the general formula (2) represents a straight chain or branched alkylene group having 1 to 6 carbon atoms or an arylene group having 6 to 12 carbon atoms.

Examples of the above-mentioned alkylene group may include a methylene group, an ethylene group, a propylene group, a butylene group, a pentylene group, a hexylene group and the like.

Examples of the above-mentioned arylene group may include a 1,2-phenylene group, a 1,3-phenylene group, a 1,4-phenylene group, substituted phenylene groups (the substituent is an alkyl group having 1 to 6 carbons or a phenyl group), a 1,4-naphthylene group, a biphenylene group and the like.

Since the compound of the present invention has finer thermal stability, $L^1$ is preferably an alkylene group having 2 to 4 carbon atoms, more preferably an ethylene group or a propylene group, and further preferably a propylene group.

Next, the general formula (3) will be explained.

$X^2$ in the general formula (3) represents a group represented by the general formula (2) or a hydrogen atom, and at least one of s number of $X^2$s is the group represented by the general formula (2). Since the thermal resistance of a resin to which the compound of the present invention has been added is improved more, the ratio of the group represented by the general formula (2) is preferably 50 mol % or more, more preferably 70 mol % or more, and further preferably 75 mol % or more with respect to the total amount of the hydrogen atom and the group represented by the general formula (2). In the case when the group represented by the general formula (2) is lower than 50 mol %, the thermal resistance of the resin may become insufficient when used as a stabilizer.

$R^6$ represents an alkyl group having 1 to 4 carbon atoms or an aryl group having 6 to 12 carbon atoms, and examples thereof may include those having 1 to 4 carbon atoms among those exemplified as the alkyl groups represented by $R^1$ to $R^4$ in the general formula (1), and those exemplified as the aryl groups having 6 to 12 carbon atoms represented by $R^1$ to $R^4$, and a methyl group, an ethyl group, a propyl group and a phenyl group are preferable, and a methyl group is further preferable since thermal resistance is better.

$L^2$ represents a straight chain or branched alkylene group having 1 to 6 carbon atoms or an arylene group having 6 to 12 carbon atoms, and examples thereof may include those exemplified as $L^1$ in the general formula (1), and $L^2$ is preferably an alkylene group having 2 to 4 carbon atoms, more preferably an ethylene group or a propylene group, and further preferably an ethylene group.

s represents a number of from 2 to 6, and a number of from 2 to 5 is preferable, a number of from 2 to 4 is more preferable, and 3 is further preferable since industrial obtainment of corresponding synthetic raw materials is easy.

Among the compounds represented by the general formula (1) of the present invention, a compound having a structure represented by the following general formula (4) is preferable for the reasons of thermal resistance and easiness of synthesis.

[Chemical Formula 4]

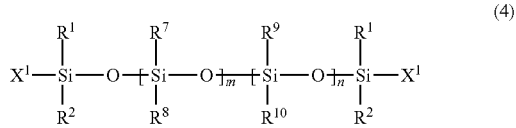

(4)

wherein $R^7$ and $R^8$ each represent a straight chain or branched alkyl group having 1 to 12 carbon atoms, $R^9$ and $R^{10}$ each represent an aryl group having 6 to 12 carbon atoms, m and n represent such numbers that m+n becomes 1 to 2,000, and $R^1$, $R^2$ and $X^1$ are similar to those in the general formula (1), provided that the compound represented by the above-mentioned general formula (4) may be a block copolymer or a random copolymer.

Since compatibility with resins is excellent, the preferable ranges of $R^1$ and $R^2$ are similar to those for the general formula (1). Examples of the straight chain or branched alkyl groups having 1 to 12 carbon atoms represented by $R^7$ and $R^8$ may include those exemplified as the alkyl groups represented by $R^1$ to $R^4$ of the general formula (1), and an alkyl group having 1 to 6 carbon atoms is preferable, a methyl group or an ethyl group is more preferable, and a methyl group is further preferable. Examples of the aryl group having 6 to 12 carbon atoms represented by $R^9$ and $R^{10}$ may include those exemplified as the aryl group represented by $R^1$ to $R^4$ of the general formula (1), and an aryl group having 6 to 10 carbon atoms is preferable, and a phenyl group is more preferable.

m+n corresponds to y in the general formula (1), and m and n each independently represent such a number that m+n becomes 1 to 2,000. m is preferably a number of from 15 to 800, and n is preferably a number of from 10 to 500. Although the ratio of m and n is not specifically limited, it is preferably from 95/5 to 65/35, more preferably from 95/5 to 70/30, and further preferably from 90/10 to 70/30 since thermal resistance is specifically high. In the case when the ratio is out of from 95/5 to 65/35, thermal resistance may be decreased, and compatibility with resins may become insufficient.

Furthermore, although the compound represented by the general formula (4) may be a random copolymer or a block copolymer, a random copolymer is produced more easily.

The production method of the compound represented by the general formula (1) of the present invention is not specifically limited, and the compound can be produced by applying known reactions. For example, a compound wherein $X^1$=a group represented by the general formula (2) and $L^1$=a propylene group may be obtained by synthesizing an intermediate P represented by the following formula (5) and an intermediate Q represented by the general formula (6) respectively, and reacting the two intermediates.

Similarly, a compound wherein $X^1$=a group represented by the general formula (3), $L^1$=a propylene group and $L^2$=an ethylene group can be produced by applying known reactions. For example, the compound may be obtained by synthesizing an intermediate R represented by the following general formula (7), reacting said intermediate R and a commercially available intermediate S represented by the following general formula (8), and thereafter reacting the reaction product with the intermediate P.

[Chemical Formula 5]

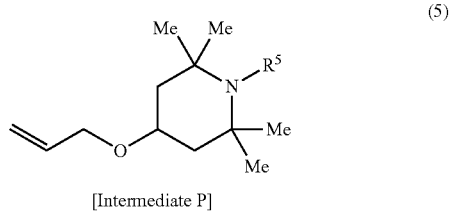

[Intermediate P]

[Chemical Formula 6]

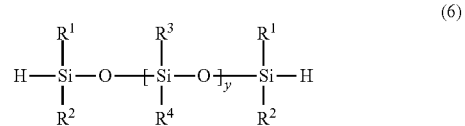

[Intermediate Q]

[Chemical Formula 7]

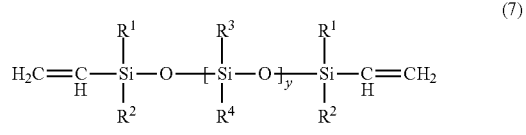

[Intermediate R]

[Chemical Formula 8]

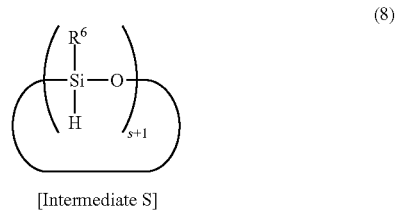

[Intermediate S]

[Synthesis of Intermediate P]

The intermediate P can be obtained by etherifying an allyl halide and a compound having a 4-hydroxy-2,2,6,6-tetramethyl backbone in the presence of a base in a solvent according to the following reaction Formula 1. The solvent and base are not specifically limited, and those used in general Williamson ether synthesis may be used. Alternatively, when water is used as the solvent, a quaternary ammonium salt may be used as a phase transfer catalyst. In addition, in the case when $L^1$ in the general formula (2) is other than a propyl group, it is only necessary to replace the above-mentioned allyl halide with a corresponding alkenyl halide.

[Reaction Formula 1]

[Chemical Formula 9]

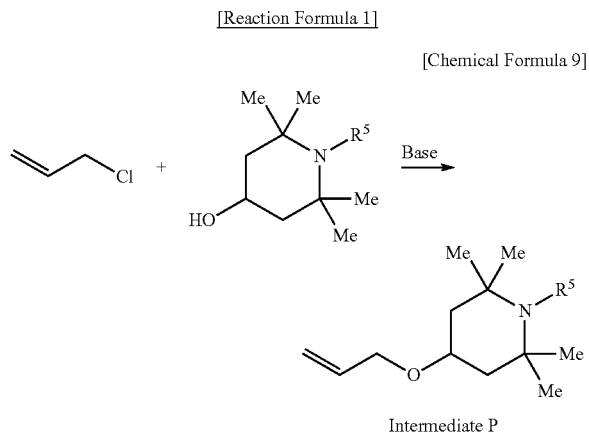

Intermediate P

[Synthesis of Intermediate Q]

As the method for the production of the intermediate Q, for example, (q-1) a method comprising decomposing and condensation-polymerizing a dihalosilane compound or a dialkoxysilane compound by a sol-gel reaction, and introducing SiH groups into the both terminals, or (q-2) a method comprising ring-opening polymerizing a cyclic siloxane compound as a starting substance, and introducing SiH groups into the terminals. Although the method for the polymerization of the intermediate Q may be random or block polymerization, production by random polymerization is preferable since production is easy.

[Reaction of Intermediate P and Intermediate Q]

The reaction of the intermediate P that has an allyl group and the intermediate Q that has two SiH groups can be conducted by a method conventionally-known as a hydrosilylation reaction. The hydrosilylation reaction between the SiH groups and allyl group is preferably conducted by using a catalyst, and examples of a hydrosilylation catalyst may include platinum catalysts, palladium catalysts, rhodium catalysts and the like. Examples of the platinum catalysts may include chloroplatinic acid, complexes of chloroplatinic acid and alcohols, aldehydes, ketones and the like, platinum-olefin complexes, platinum carbon complexes, a platinum-carbonylvinylmethyl complex (Ossko catalyst), a platinum-divinyltetramethyldisiloxane complex (KaRstedt catalyst), a platinum-cyclovinylmethylsiloxane complex, a platinum-octylaldehyde complex, platinum-phosphine complexes (for example, $Pt[P(C_6H_5)_3]_4$, $PtCl[P(C_6H_5)_3]_3$, $Pt[P(C_4H_9)_3]_4$], platinum-phosphite complexes (for example, $Pt[P(OC_6H_5)_3]_4$), $Pt[P(OC_4H_9)_3]_4$), dicarbonyldichloroplatinum and the like. Examples of the palladium catalysts or rhodium catalysts may include compounds containing a palladium atom or a rhodium atom instead of the platinum atom in the above-mentioned platinum catalysts. These may be used by one kind or as a combination of two or more kinds. As the hydrosilylation catalyst, the platinum catalysts are preferable, the platinum-divinyltetramethyldisiloxane complex and platinum-carbonylvinylmethyl complex are further preferable, and the platinum-carbonylvinylmethyl complex is the most preferable in view of reactivity. Furthermore, the use amount of the catalyst is preferably 5 mass % or less, further preferably from 0.0001 to 1.0 mass %, and the most preferably from 0.001 to 0.1 mass % of the total amount of the respective raw materials in view of reactivity. Although the reaction conditions for the hydrosilylation are not specifically limited, and the hydrosilylation may be conducted under conventionally known conditions by using the above-mentioned catalyst, it is preferable to conduct the hydrosilylation at from 25° C. to 130° C. in view of reaction velocity, and a conventionally known solvent such as toluene, hexane, methyl isobutyl ketone, cyclopentanone and propylene glycol monomethyl ether acetate may be used during the reaction.

[Synthesis of Intermediate R]

Examples of the method for the production of the intermediate R may include, in the case when $L^2$ in the general formula (3) is an ethylene group, (r-1) a method comprising decomposing and condensation-polymerizing a dihalosilane compound or a dialkoxysilane compound by a sol-gel reaction, and introducing vinyl groups into the both terminals, (r-2) a method comprising ring-opening polymerizing a cyclic siloxane compound as a starting substance, and introducing vinyl groups into the terminals, and (r-3) a method comprising inserting a cyclic siloxane compound into a siloxane compound having vinyl groups on the both ends and conducting equilibration polymerization. Although the method for the polymerization of the intermediate R may be random or block polymerization, production by random polymerization is preferable since production is easy.

[Reaction of Intermediate R and Intermediate S]

The reaction between the vinyl groups of the intermediate R and the SiH groups of the intermediate S may be a reaction that is conventionally known as a hydrosilylation reaction, the catalyst and solvent as exemplified for the reaction of the intermediate P and intermediate Q may be used, and preferable catalysts, use amount of the catalyst and reaction temperature are the same.

For example, in the case when $L^1$=a propylene group, the generated synthesized product can be converted to a desired compound by reacting it with the intermediate P.

Although the mass average molecular weight of the compound represented by the general formula (1) of the present invention is not specifically limited as long as it is within the range of the value of the average polymerization degree y, it is preferably from 1000 to 1,000,000, and more preferably from 5,000 to 40,000. In the case when the mass average molecular weight is out of 1,000 to 1,000,000, the compound represented by the general formula (1) may have too high viscosity or have insufficient compatibility with resins.

In the present invention, the mass average molecular weight refers to a mass average molecular weight in polystyrene conversion which is analyzed by GPC (Gel Permeation Chromatography, also referred to as gel permeation chromatography) using tetrahydrofuran as a solvent.

The compound of the present invention is useful as an agent for imparting stability to resins. The compound of the present invention is specifically suitable as an agent for imparting thermal resistance to resins, and can be used as a stabilizer for imparting required weather resistance, physical properties, stability and the like to resins that are used for uses in which the resins are exposed outdoors, uses for which weather resistance is required, uses for which maintenance of physical properties is required, and the like.

Next, the resin composition of the present invention will be explained. The resin composition of the present invention contains the compound of the present invention by from 0.001 to 10 parts by mass with respect to 100 parts by mass of the resin. The content of the compound of the present invention is preferably from 0.01 to 5 parts by mass, further preferably from 0.1 to 3 parts by mass, and the most preferably from 0.5 to 2 parts by mass with respect to 100 parts by mass of the resin. When the content is lower than 0.001 part by mass, the effect may become insufficient, whereas when the content is more than 10 parts by mass, compatibility with the resin may be deteriorated.

The resin used for the resin composition of the present invention is not specifically limited as long as it has been conventionally used as a resin, and examples thereof may include polyolefin resins such as high-density polyethylene, isotactic polypropylene, syndiotactic polypropylene, hemi-isotactic polypropylene, polybutene-1, poly 3-methyl-1-butene, poly 3-methyl-1-pentene, poly 4-methyl-1-pentene, ethylene/propylene block or random copolymers, ethylene-vinyl acetate copolymers and olefin-maleimide copolymers, and copolymers of monomers that give these polymers; halogen-containing resins such as polyvinyl chloride, polyvinylidene chloride, chlorinated polyethylene, polyvinylidene fluoride, chloride rubbers, vinyl chloride-vinyl acetate copolymers, vinyl chloride-ethylene copolymers, vinyl chloride-vinylidene chloride-vinyl acetate tercopolymers, vinyl chloride-acrylic acid ester copolymers, vinyl chloride-maleic acid ester copolymers and vinyl chloride-cyclohexylmaleimide copolymers; polyester resins such as polyethylene telephthalate (PET), polybutylene telephthalate (PBT), polyethylene naphthalate (PEN), poly-1,4-cyclohexanedimethylene telephthalate, polyethylene-1,2-diphenoxyethane-4,4'-dicarboxylate and polyhexamethylene telephthalate; styrene resins such as polystyrene, high-impact polystyrene (HIPS), acrylonitrile-butadiene-styrene (ABS), chlorinated polyethylene-acrylonitrile-styrene (AC S), styrene-acrylonitrile (SAN), acrylonitrile-butylacrylate-styrene (AAS), butadiene-styrene, styrene-maleic acid, styrene-maleimide, ethylene-propylene-acrylonitrile-styrene (AES) and butadiene-methyl methacrylate-styrene (MBS); polycarbonate resins such as polycarbonates and branched polycarbonates; polyamide resins such as polyhexamethylene adipamide (nylon 66), polycaprolactam (nylon 6), and polyamides using aromatic dicarboxylic acids and alicyclic dicarboxylic acids such as nylon 6T; polyphenyleneoxide (PPO) resins; modified polyphenyleneoxide resins; polyphenylenesulfide (PPS) resins; polyacetals (POM); modified polyacetals; polysulfones; polyether sulfones; polyether ketones; polyether imides; polyoxyethylenes; petroleum resins; coumarone resins; cycloolefin resins such as norbornene resins, cycloolefin-olefin copolymer resins; polyvinyl acetate resins; polyvinyl alcohol resins; acrylic resins such as polymethyl methacrylate; polymer alloys of polycarbonates and styrene resins; polyvinyl alcohol resins; cellulose resins such as diacetyl cellulose, triacetyl cellulose (TAC), propionyl cellulose, butyryl cellulose, acetylpropionyl cellulose and nitrocellulose; liquid crystal polymers (LCP); silicon resins; urethane resins; biodegradable resins such as aliphatic polyesters from aliphatic dicarboxylic acids, aliphatic diols, aliphatic hydroxycarboxylic acids or cyclic compounds thereof, or aliphatic polyesters obtained by increasing the molecular weight thereof by diisocyanate or the like; and recycle resins therefrom, and the like. Furthermore, examples of the resin may include polysiloxanes, siloxane copolymers, phenol resins, urea resins, melamine resins, epoxy resins, unsaturated polyester resins and the like. Moreover, rubber polymer compounds such as natural rubbers (NR), polyisoprene rubbers (IR), styrene-butadiene-rubbers (SBR), polybutadiene rubbers (BR), ethylene-propylene-diene rubbers (EPDM), butyl rubbers (IIR), chloroprene rubbers, acrylonitrile-butadiene-rubbers (NBR) and silicone rubbers may also be used.

The above-mentioned polysiloxane is a polymer that has been polymerized from a siloxane monomer, and has repeating units of siloxane bonds in the structure. Furthermore, the above-mentioned siloxane copolymer is a copolymer of a resin selected from a polyamide, a polyimide and an epoxy, and the like, and the above-mentioned polysiloxane.

Among the above-mentioned resins, it is preferable to use thermosetting resins such as urethane resins, phenol resins, urea resins, melamine resins, epoxy resins, polyaminobismaleimide resins, polysiloxanes, siloxane copolymers and unsaturated polyester resins. Specifically, in the case when the resin composition of the present invention is used for uses in a sealant for a semiconductor device and an adhesive for a semiconductor device, epoxy resins, polyaminobismaleimide resins, polysiloxanes and siloxane copolymers are more preferable, polysiloxanes and polysiloxane copolymers are further preferable since they have specifically high effects of improving compatibility and of improving thermal stability, and polysiloxanes are the most preferable.

Among the polysiloxanes, it is preferable to use a polysiloxane represented by the following general formula (X) since it has a notably high effect of improving compatibility with the compound represented by the general formula (1) of the present invention and thermal resistance.

[Chemical Formula 10]

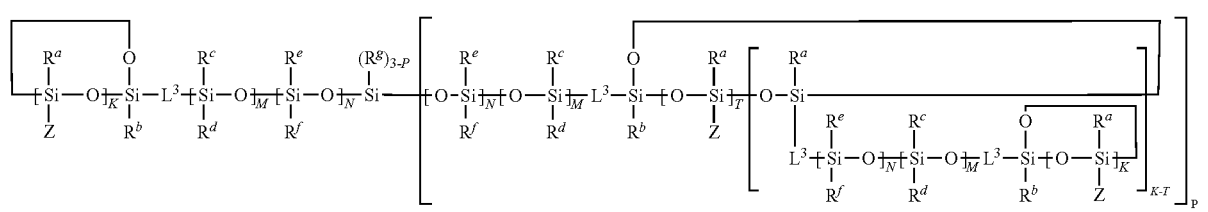

(X)

wherein $R^a$ to $R^g$ may be the same or different, and each represent a straight chain or branched alkyl group having 1 to 12 carbon atoms or an aryl group having 6 to 12 carbon atoms, provided that $R^e$ and $R^f$ do not simultaneously represent straight chain or branched alkyl groups having 1 to 12 carbon atoms, $L^3$ is an alkylene group having 2 to 4 carbon atoms, Z is a hydrogen atom or a alkenyl group or alkynyl group having 2 to 4 carbon atoms, K is a number of from 2 to 7, T is a number of from 1 to 7, and P is a number of from 0 to 3; M and N are such numbers that M:N=1:1 to 1:100 and the total of all Ms and all Ns becomes 15 or more, and also such numbers that the mass average molecular weight of the polysiloxane becomes from 3000 to 1,000,000.

Examples of the straight chain or branched alkyl group having 1 to 12 carbon atoms or aryl group having 6 to 10 carbon atoms represented by $R^a$ to $R^e$ in the above-mentioned general formula (X) may include the groups that are exemplified for $R^1$ to $R^4$ in the above-mentioned general formula (1). In addition, the polymerized part with M as a number of repeating and the polymerized part with N as a number of repeating may be a block form or a random form.

Examples of the alkylene group having 2 to 4 carbon atoms represented by $L^3$ in the above-mentioned general formula (X) may include an ethylene group, a propylene group, a butylene group and the like, and an ethylene group is preferable since thermal resistance is high. K is preferably 3 since synthesis is easy.

Examples of the alkenyl group having 2 to 4 carbon atoms represented by Z may include $CH_2=CH-$, $CH_2=CH-CH_2-$, $CH_2=CH-CH_2-CH_2-$, $CH_2=C(CH_3)-$, $CH_2=C(CH_3)-CH_2-$, $CH_2=CH-CH(CH_3)-$ and the like. Examples of the alkynyl group having 2 to 4 carbon atoms represented by Z may include the following groups. Z is preferably a hydrogen atom.

[Chemical Formula 11]

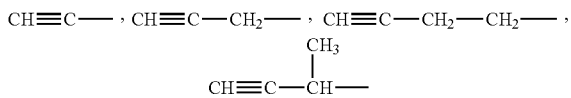

A preferable embodiment of the polysiloxane represented by the above-mentioned general formula (X) is a polysiloxane represented by the following general formula (X-a). The polysiloxane represented by the following general formula (X-a) is the polysiloxane represented by the above-mentioned general formula (X) wherein T=K.

The method for the synthesis of the polysiloxane represented by the above-mentioned general formula (X) is not specifically limited, and said polysiloxane can be obtained, for example, according to the above-mentioned reaction of the intermediate R and intermediate S; however, a polysiloxane that can be obtained by such general synthesis technique is a polysiloxane represented by the following general formula (X-a), or a mixture of plural kinds of polysiloxanes represented by the above-mentioned general formula (X), which contains the polysiloxane represented by the following general formula (X-a) as a major component. For example, a compound wherein K-T in the above-mentioned general formula (X) is a number more than 1 is generated slightly even in the case when a cyclopolysiloxane represented by multifunctional $(R^a SiHO)_k$ is used as a compound for introducing cyclopolysiloxane rings. This is because the generation of a compound in which non-cyclic polysilixanes are bound to two or more of Si—Hs in the cyclopolysilixane via $L^3$ is disadvantageous since it requires large energy.

[Chemical Formula 12]

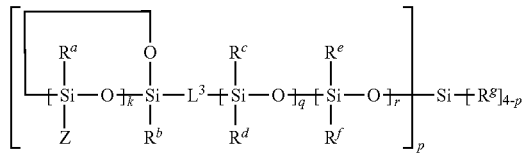

wherein $R^a$ to $R^g$ may be the same or different and each represent a straight chain or branched alkyl group having 1 to 12 carbon atoms or an aryl group having 6 to 12 carbon atoms, provided that $R^e$ and $R^f$ do not simultaneously represent straight chain or branched alkyl groups having 1 to 12 carbon atoms, $L^3$ is an alkylene group having 2 to 4 carbon atoms, Z is a hydrogen atom or a alkenyl group or alkynyl group having 2 to 4 carbon atoms, k is a number of from 2 to 7, and p is a number of from 1 to 4; q and r are numbers that give rq=1:1 to 1:100 and q+r≥15, and also such numbers that the mass average molecular weight of the polysiloxane represented by the general formula (X-a) becomes from 3000 to 1,000,000. Furthermore, the polymerized part with q as a number of repeating and the polymerized part with r as a number of repeating may be in a block form or a random form.

In $R^a$ to $R^g$ in the above-mentioned general formula (X) or general formula (X-a), when the ratio of the straight chain or branched alkyl group having 1 to 12 carbon atoms is increased, the flexibility of the obtained cured product is improved, and when the ratio of the aryl group having 6 to 12 carbon atoms is increased, the thermal resistance and hardness of the obtained cured product are improved. The ratio of said alkyl group and said aryl group can optionally be set according to the physical properties required for the cured product. The ratio (number) of said alkyl group:said aryl group is preferably from 100:1 to 1:2, and more preferably from 20:1 to 1:1. Furthermore, the alkyl group having 1 to 12 carbon atoms is preferably a methyl group since thermal resistance is fine, and the aryl group having 6 to 12 carbon atoms is preferably a phenyl group since thermal resistance is fine.

Furthermore, K in the above-mentioned general formula (X) and k in the above-mentioned general formula (X-a) are each from 2 to 7. When they are larger than 7, the number of the functional groups is too much and flexibility required for the obtained cured product cannot be obtained. K and k are each preferably from 2 to 5 since raw materials can be obtained readily in industrial and the number of the functional groups is appropriate, and 3 is the most preferable.

The mass average molecular weight of the polysiloxane represented by the general formula (X) or (X-a) is from 3,000 to 1,000,000. When the mass average molecular weight is lower than 3,000, the obtained cured product has insufficient thermal resistance, whereas when the mass average molecular weight is larger than 1,000,000, the viscosity is increased and handling is interfered. The mass average molecular weight is preferably from 5,000 to 500,000, and more preferably from 10,000 to 100,000.

In the resin composition of the present invention, the thermal stability is further improved by using the compound represented by the general formula (1) of the present invention and an inorganic powder body in combination. Although the inorganic powder body that can be used for the present invention is not specifically limited, examples thereof may include metals, inorganic salts, metal oxides, natural minerals, fillers and the like, and more specific examples thereof may include copper, silver, nickel, gold, platinum, palladium, alumina, zirconia, titanium dioxide, barium titanate, tin oxide, ITO, alumina nitride, silicon nitride, boron nitride, silicate glass, lead glass, zinc oxide, magnesium oxide, aluminum oxide, FeO, $Fe_2O_3$, $B_2O_3$, $TiO_3$, $ZrO_3$, $SnO_3$, $CeO_3$, $P_3O_3$, $Sb_2O_3$, $MoO_3$, $ZnO_2$, $WO_3$, $CaF_2$, NaF, $CaCO_3$, $MgF_2$, $NaAlF_6$, $BaAlO_4$, $SrAlO_4$, mica, zeolite, perlite, bentonite, blast-furnace slug, talc, glass, clay, magnesium oxysulfate, cinder ash, husk ash, fly ash, clinker ash, mullite, magnesia, spinel, silica and the like, and titanium dioxide, zinc oxide and aluminum oxide are preferable, titanium dioxide and zinc oxide are more preferable, and titanium dioxide is further preferable since they have high effect of combination use with the compound of the present invention.

Examples of titanium dioxide include rutile-type $TiO_2$, anatase-type $TiO_2$, brookite-type $TiO_2$, fumed $TiO_2$ that is made by hydrolysis of titanium tetrachloride and the like, and anatase-type $TiO_2$, brookite-type $TiO_2$ and fumed $TiO_2$ are preferable, and fumed $TiO_2$ is more preferable in the present invention.

The above-mentioned inorganic powder body has a particle size of preferably from 1 nm to 100 μm in view of dispersibility, mixing property, viscosity and the like.

In the case when the above-mentioned inorganic powder body is used, the inorganic powder body is incorporated by preferably from 0.001 to 20 parts by mass, more preferably from 1 to 10 parts by mass, and further preferably from 2 to 7 parts by mass with respect to 100 parts by mass of the resin. In the cases when the inorganic powder body is lower than 0.001 part by mass and more than 20 parts by mass, the effect of combination use may be insufficient.

In the resin composition of the present invention, generally used additives such as antioxidants (phenol-based, phosphorus-based or thioether-based antioxidants, and the like), ultraviolet absorbers (benzotriazole ultraviolet absorbers, triazine ultraviolet absorbers, benzophenone ultraviolet absorber and the like), hindered amine stabilizers other than the compound of the present invention, plasticizers and processing aids can be incorporated according to the kind of the resin used. When these additives (except for the above-mentioned inorganic powder body) are incorporated, although the contents thereof can suitably be selected according to the purposes of use of the respective additives, and the like, it is preferable that the contents are within the range of 10 parts by mass or less by the total amount of all additives with respect to 100 parts by mass of the resin, from the viewpoint of avoiding deterioration of the effects of the present invention.

Examples of the above-mentioned phenol antioxidants may include 2,6-di-tert-butyl-p-cresol, 2,6-diphenyl-4-octadecyloxyphenol, distearyl(3,5-di-tert-butyl-4-hydroxybenzyl)phosphonate, 1,6-hexamethylenebis[(3,5-di-tert-butyl-4-hydroxyphenyl)propionic acid amide], 4,4'-thiobis(6-tert-butyl-m-cresol), 2,2'-methylenebis(4-methyl-6-tert-butylphenol), 2,2'-methylenebis(4-ethyl-6-tert-butylphenol), 4,4'-butylidenebis(6-tert-butyl-m-cresol), 2,2'-ethylidenebis(4,6-di-tert-butylphenol), 2,2'-ethylidenebis(4-tert-butyl-6-tert-butylphenol), 1,1,3-tris(2-methyl-4-hydroxy-5-tert-butylphenyl)butane, 1,3,5-tris(2,6-dimethyl-3-hydroxy-4-tert-butylbenzyl)isocyanurate, 1,3,5-tris(3,5-di-tert-butyl-4-hydroxybenzyl)isocyanurate, 1,3,5-tris(3,5-di-tert-butyl-4-hydroxybenzyl)-2,4,6-trimethylbenzene, 2-tert-butyl-4-methyl-6-(2-acryloyloxy-3-tert-butyl-5-methylbenzyl) phenol, stearyl(3,5-di-tert-butyl-4-hydroxyphenyl) propionate, thiodiethylene glycolbis[(3,5-di-tert-butyl-4-hydroxyphenyl)propionate], 1,6-hexamethylenebis[(3,5-di-tert-butyl-4-hydroxyphenyl)propionate], bis[3,3-bis(4-hydroxy-3-tert-butylphenyl)butyric acid]glycol ester, bis[2-tert-butyl-4-methyl-6-(2-hydroxy-3-tert-butyl-5-methylbenzyl)phenyl]telephthalate, 1,3,5-tris[(3,5-di-tert-butyl-4-hydroxyphenyl)propionyloxyethyl]isocyanurate, 3,9-bis[1,1-dimethyl-2-{(3-tert-butyl-4-hydroxy-5-methylphenyl)propionyloxy}ethyl]-2,4,8,10-tetraoxaspiro[5,5] undecane, triethyleneglycolbis[(3-tert-butyl-4-hydroxy-5-methylphenyl)propionate] and the like.

Examples of the above-mentioned phosphorous-based antioxidants may include [2-tert-butyl-4-(3-tert-butyl-4-hydroxy-5-methylphenylthio)-5-methylphenyl]phosphite, tridecyl phosphite, octyldiphenyl phosphite, di(decyl) monophenyl phosphite, di(tridecyl)pentaerythritol diphosphite, di(nonylphenyl)pentaerythritol diphosphite, bis(2,4-di-tert-butylphenyl)pentaerythritol diphosphite, bis(2,6-di-tert-butyl-4-methylphenyl)pentaerythritol diphosphite, bis(2,4,6-tri-tert-butylphenyl)pentaerythritol diphosphite, bis(2,4-dicumylphenyl)pentaerythritol diphosphite, tetra(tridecyl) isopropylidenediphenol diphosphite, tetra(tridecyl)-4,4'-n-butylidenebis(2-tert-butyl-5-methylphenol)diphosphite, hexa(tridecyl)-1,1,3-tris(2-methyl-4-hydroxy-5-tert-butylphenyl)butanetriphosphite, tetrakis(2,4-di-tert-butylphenyl)biphenylenediphosphonite, 9,10-dihydro-9-oxa-10-phosphaphenanthrene-10-oxide, 2,2'-methylenebis(4,6-tert-butylphenyl)-2-ethylhexyl phosphite, 2,2'-methylenebis(4,6-tert-butylphenyl)-octadecyl phosphite, 2,2'-ethylidenebis(4,6-di-tert-butylphenyl)fluorophosphite, tris(2-[(2,4,8,10-tetrakis-tert-butyldibenzo[d,f][1,3,2]dioxaphosphepin-6-yl) oxy]ethyl)amine, phosphites of 2-ethyl-2-butylpropylene glycol and 2,4,6-tri-tert-butylphenol, and the like.

Examples of the above-mentioned thioether antioxidants may include dialkyl thiodipropionates such as dilauryl thiodipropionate, dimyristyl thiodipropionate and distearyl thiodipropionate, and β-alkylmercaptopropionic acid esters of polyols such as pentaerythritol tetra(β-dodecylmercaptopropionate).

The content of the antioxidant is preferably from 0.001 to 10 parts by mass, and more preferably from 0.05 to 5 parts by mass with respect to 100 parts by mass of the resin.

Examples of the above-mentioned benzotriazole ultraviolet absorbers may include 2-(T-hydroxyphenyl)benzotriazoles such as 2-(2'-hydroxy-5'-methylphenyl)benzotriazole, 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(T-hydroxy-5'-tert-octylphenyl)benzotriazole, 2-(2'-hydroxy-3',5'-dicumylphenyl)benzotriazole, 2-(2'-hydroxy-3'-tert-butyl-5'-carboxyphenyl)benzotriazole and 2,2'-methylenebis(4-tert-octyl-6-benzotriazolyl)phenol.

Examples of the above-mentioned triazine ultraviolet absorbers may include triaryltriazines such as 2-(2-hydroxy-4-octoxyphenyl)-4,6-bis(2,4-dimethylphenyl)-s-triazine, 2-(2-hydroxy-4-hexyloxyphenyl)-4,6-diphenyl-s-triazine, 2-(2-hydroxy-4-propoxy-5-methylphenyl)-4,6-bis(2,4-dimethylphenyl)-s-triazine, 2-(2-hydroxy-4-hexyloxyphenyl)-4,6-dibiphenyl-s-triazine, 2,4-bis(2-hydroxy-4-octoxyphenyl)-6-(2,4-dimethylphenyl)-s-triazine and 2,4,6-tris(2-hydroxy-4-octoxyphenyl)-s-triazine.

Examples of the above-mentioned benzophenone ultraviolet absorbers may include 2-hydroxybenzophenones such as 2,4-dihydroxybenzophenone, 2-hydroxy-4-methoxybenzophenone, 2-hydroxy-4-octoxybenzophenone and 5,5'-methylenebis(2-hydroxy-4-methoxybenzophenone).

The content of the above-mentioned ultraviolet absorber is preferably from 0.01 to 10 parts by mass, and more preferably from 0.05 to 5 parts by mass with respect to 100 parts by mass of the resin.

Examples of the hindered amine stabilizers other than the above-mentioned compound of the present invention may include 2,2,6,6-tetramethyl-4-piperidyl stearate, 1,2,2,6,6-pentamethyl-4-piperidyl stearate, 2,2,6,6-tetramethyl-4-piperidyl benzoate, bis(2,2,6,6-tetramethyl-4-piperidyl)sebacate, bis(1,2,2,6,6-pentamethyl-4-piperidyl)sebacate, bis(1-octoxy-2,2,6,6-tetramethyl-4-piperidyl)sebacate, 1,2,2,6,6-pentamethyl-4-piperidyl methacrylate, 2,2,6,6-tetramethyl-piperidyl methacrylate, tetrakis(2,2,6,6-tetramethyl-4-piperidyl)-1,2,3,4-butanetetracarboxylate, tetrakis(1,2,2,6,6-pentamethyl-4-piperidyl)-1,2,3,4-butanetetracarboxylate, bis(2,2,6,6-tetramethyl-4-piperidyl)bis(tridecyl)-1,2,3,4-butanetetracarboxylate, bis(1,2,2,6,6-pentamethyl-4-piperidyl) bis(tridecyl)-1,2,3,4-butanetetracarboxylate, bis(1,2,2,6,6-pentamethyl-4-piperidyl)-2-butyl-2-(3,5-di-tert-butyl-4-hydroxybenzyl)malonate, 3,9-bis[1,1-dimethyl-2-[tris(2,2,6, 6-tetramethyl-4-piperidyloxycarbonyloxy)butylcarbonyloxy]ethyl]-2,4,8,10-tetraoxaspiro[5.5]undecane, 3,9-bis[1,1-dimethyl-2-[tris(1,2,2,6,6-pentamethyl-4-piperidyloxycarbonyloxy)butylcarbonyloxy]ethyl]-2,4,8,10-tetraoxaspiro[5.5]undecane, 1,6-bis(2,2,6,6-tetramethyl-4-piperidylamino)hexane/2,4-dichloro-6-morpholino-s-tiazine polycondensate, 1,6-bis(2,2,6,6-tetramethyl-4-piperidylamino)hexane/2,4-dichloro-6-tert-octylamino-s-triazine polycondensate, 1,5,8,12-tetrakis[2,4-bis(N-butyl-N-(2,2,6,6-tetramethyl-4-piperidyl)amino)-s-triazine-6-yl]-1,5,8,12-tetraazadodecane, 1,5,8,12-tetrakis[2,4-bis(N-butyl-N-(1,2,2,6,6-pentamethyl-4-piperidyl)amino)-s-triazine-6-yl]-1,5,8,12-tetraazadodecane, 1,6,11-tris[2,4-bis(N-butyl-N-(2,2,6,6-tetramethyl-4-piperidyl)amino)-s-triazine-6-ylamino]undecane, 1,6,11-tris[2,4-bis(N-butyl-N-(1,2,2,6,6-pentamethyl-4-piperidyl)amino)-s-triazine-6-ylamino]undecane, 1-(2-hydroxyethyl)-2,2,6,6-tetramethyl-4-piperidinol/diethyl succinate polycondensate, 1,6-bis(2,2,6,6-tetramethyl-4-piperidylamino)hexane/dibromoethane polycondensate and the like.

The content of the above-mentioned hindered amine stabilizer is preferably from 0.001 part by mass to 10 parts by mass with respect to 100 parts by mass of the resin. Furthermore, the content of the above-mentioned hindered amine stabilizer is preferably 10 mass % or less with respect to the content of the compound of the present invention.

Examples of the above-mentioned plasticizers may include phosphoric acid ester plasticizers and polyester plasticizers, and these may be used alone of by mixing two or more kinds. Examples of the above-mentioned phosphoric acid ester plasticizers may include triphenyl phosphate, tricresyl phosphate, cresyl diphenyl phosphate, octyl diphenyl phosphate, diphenyl biphenyl phosphate, trioctyl phosphate, tributyl phosphate and the like.

Examples of the above-mentioned polyester plasticizers may include chain polyesters composed of aliphatic dibasic acids and/or aromatic dibasic acids and diol compounds, and chain polyesters of hydroxycarboxylic acids. Examples of the above-mentioned aliphatic dibasic acids may include oxalic acid, malonic acid, succinic acid, glutal acid, adipic acid, pimellic acid, azelaic acid, sebacic acid, fumaric acid, 2,2-dimethylglutalic acid, suberic acid, 1,3-cyclopentanedicarboxylic acid, 1,4-cyclohexanedicarboxylic acid, 1,3-cyclohexanedicarboxylic acid, diglycolic acid, itaconic acid, maleic acid, 2,5-norbornenedicarboxylic acid and the like. Examples of the aromatic dibasic acids may include phthalic acid, 1,5-naphthalenedicarboxylic acid, 2,6-naphthalenedicarboxylic acid, biphenyldicarboxylic acid, anthracenedicarboxylic acid, terphenyldicarboxylic acid and the like.

Examples of the above-mentioned diol compounds may include ethylene glycol, propylene glycol, 1,3-propanediol, 1,2-butanediol, 1,3-butanediol, 1,4-butanediol, 2-methylpropanediol, 1,3-dimethylpropanediol, 1,5-pentanediol, 2,2-dimethyl-1,3-propanediol, 1,6-hexanediol, 3-methyl-1,5-pentanediol, 1,9-nonanediol, 2,2,4-trimethyl-1,6-hexanediol, 2-ethyl-2-butylpropanediol, diethylene glycol, triethylene glycol, tetraethylene glycol, dipropylene glycol, tripropylene glycol, tetrapropylene glycol, thiodiethylene glycol, 1,3-cyclohexanedimethanol, 1,4-cyclohexanedimethanol, 2,2,4,4-tetramethyl-1,3-cyclobutanediol, 3,9-bis(2-hydroxy-1,1-dimethylethyl)-2,4,8,10-tetraoxaspiro[5,5]undecane and the like.

Examples of the above-mentioned hydroxycarboxylic acids may include 4-hydroxylmethylcyclohexanecarboxylic acid, hydroxytrimethylacetic acid, 6-hydroxycaploic acid, glycolic acid, lactic acid and the like.

Furthermore, examples of other polyester plasticizers may include polyesters of tri- or more valent polyols and monocarboxylic acids. Examples of the tri- or more valent polyols may include glycerin, trimethylolpropane, pentaerythritol, sorbitol and condensates thereof such as dipentaerythritol and tripentaerythritol, and the like. Alternatively, polyether polyols obtained by adding an alkylene oxide such as ethylene oxide to these polyols may also be used. Examples of the above-mentioned monocarboxylic acids may include aromatic carboxylic acids such as benzoic acid, p-methylbenzoic acid, m-methylbenzoic acid, dimethylbenzoic acid, p-tert-butylbenzoic acid, p-methoxybenzoic acid, p-chlorobenzoic acid, naphthyl acid and biphenylcarboxylic acid; alicyclic carboxylic acids such as cyclohexanecarboxylic acid; aliphatic acids such as acetic acid, propionic acid and 2-ethylhexanoic acid. The monocarboxylic acids may be alone or mixed.

The content of the above-mentioned plasticizer is preferably from 0 to 20 mass % in the resin composition in view of processability and the like. The content is further preferably from 1 to 15 mass %, and specifically preferably from 2 to 10 mass % in view of size stability. Furthermore, polyester plasticizers are preferable in terms of hydrolysis.

The resin composition of the present invention can be used for uses in various molded articles, adhesives, sealing agents, coating agents and the like according to the kind of the resin. Since the resin composition of the present invention is excellent in thermal resistance, weather resistance and light stability, it is preferably used for uses in which the resin is molded by various molding processes (solution casting process, injection molding process, melt extrusion process and the like), uses in which the resin is exposed outdoors, use for which thermal resistance for a long term is required, and the like. Since the resin composition of the present invention is specifically excellent in thermal resistance, and maximally exerts the effect of the present invention and thus is specifically useful in the case when the resin composition is used in a circumstance in which it is exposed to a condition at more than 200° C. for a long term, the resin composition is preferably used for uses in a sealant for a semiconductor device and an adhesive for a semiconductor device which are used at high temperatures, and is more preferably used for use in a sealant for a semiconductor. In use in a sealant for a semiconductor device, occurrence of weight loss due to thermal deterioration and the like is not preferable since staining in the device due to the sublimation of decomposed products and decrease in sealing performance occur. The resin composition of the present invention can solve such problem.

Among the resin composition of the present invention, a polysiloxane in which the compound of the present invention is incorporated has fine electrical insulating property at a high temperature and becomes a cured product whose electrical insulating property is decreased little even used at a high temperature, and thus can be preferably used as a sealant for power semiconductors, specifically SiC power semiconductors that are specifically used as medium to high-volume power semiconductors, and for modules and devices comprising combination of these semiconductors. Examples of such power semiconductor devices may include GTO (Gate Turn Off) thyristors, insulated gate bipolar transistors (IGBTs: Insulated Gate Bipolar Transistors), metal oxide semiconductor field effect transistors (MOSFETs: Metal Oxide Semiconductor Field Effect Transistors), static induction transistors (SITS: Static Induction Transistors), diodes, power transistors, thyristors, TRIACs and the like. Examples of the modules may include universal inverter modules, IPMs (intelligent Power Modules), inverter modules for automobiles and the like.

In the case when a thermosetting polysiloxane is used as the resin in the resin composition of the present invention, the resin composition of the present invention can be cured by a known method. For example, it can be cured by polymerizing by heating to from 25 to 250° C. for from 0.1 to 1 hour using a catalyst as necessary.

The power semiconductor devices and modules using the resin composition of the present invention as a sealant or the like can be used for railway vehicles, heavy electric plants, hybrid automobiles, electrical automobiles, robotic welders, elevators, air conditioners, UPSs (uninterruptible power sources), universal inverters (control instruments for universal motors), laundry machines, microwave ovens, electromagnetic cooking machines, electrical fans, refrigerators, electrical rice cookers, VTRs, audio devices and the like.

EXAMPLES

Hereinafter the present invention will be explained in more detail by Examples and Comparative Examples and the like. However, the present invention is not construed to be limited at all by the following Examples and the like. In addition, unless otherwise stated, the "part" and "%" in Examples and the like are on the basis of mass.

The intermediate P was synthesized in the following Production Example 1, the intermediate Q was synthesized in the following Production Examples 2 and 3, and the intermediate R was synthesized and said intermediate R and the intermediate S were reacted to give a reaction product in the following Production Example 4. In addition, the reaction product (intermediate 2-3) obtained in Production Example 4 falls within the polysiloxane represented by the general formula (X-a).

Furthermore, in the following Production Examples 5 and 6, intermediates used as resins (polysiloxanes) were synthesized. These intermediates are further (co)polymerized by heating and converted into polymers.

In the following Examples 1-1 to 1-3, the compound of the present invention was synthesized by using the intermediates obtained in Production Examples 1 to 4. In the following Examples 2-1 to 2-15, resin compositions were prepared by using the compounds of the present invention obtained in Examples 1-1 to 1-3, and in the following Comparative Examples 1-1 to 1-8, resin compositions were prepared by using comparative compounds.

Production Example 1

Synthesis of Intermediate 1

To a 1,000 ml four-necked flask equipped with a stirrer, a thermometer and a dropping funnel were added 1,2,2,6,6-pentamethylpiperidin-4-ol (100 g, 0.53 mmol), tetrabutylammonium hydrogensulfate (10 g, 0.03 mmol) and allyl chloride (202 g, 2.69 mmol). Stirring was conducted at 25° C., a 12.5 mol/l aqueous sodium hydroxide solution (200 ml) was added dropwise over 30 minutes, and after the completion of the dropwise addition, stirring was conducted at 50° C. for 6 hours. After the reaction was completed, the reactant was cooled to 25° C., and 150 g of toluene was added. For oil-water separation, 250 g of water was added, stirring was conducted at 25° C. for 30 minutes, and the aqueous layer was removed. Similar operations for oil-water separation were conducted eight times. The solvent and unreacted substances were distilled off from the residual organic layer under a reduced pressure to give 119.7 g of intermediate 1 (yield: 90%).

Production Example 2

Synthesis of Intermediate 2-1

To a 3,000 ml four-necked flask equipped with a stirrer, a thermometer, a nitrogen-sealed tube and a cooling tube were added octaphenylcyclotetrasiloxane (361 g, 0.46 mol), potassium methoxide (28.6 g, 0.41 mol) and octamethylcyclotetrasiloxane (540 g, 1.82 mol), and stirring was conducted under a nitrogen flow at 150° C. for 1.5 hours. After the reaction was completed, the reactant was cooled to 50° C., toluene (600 g) and 6N hydrochloric acid (1.50 kg) were added, and reflux was conducted under a nitrogen flow at 90° C. for 14 hours. After cooling to 50° C. and removal of the aqueous layer, a 0.1% aqueous pyridine solution (1.50 kg) was added for oil-water separation, stirring was conducted at 50° C. for 30 minutes, and the aqueous layer was removed. Similarly, the operation for oil-water separation was conducted once by using a 0.1% aqueous pyridine solution, and oil-water separation was conducted once by using water (1.50 kg). The product was further cooled to 40° C. and refluxed at 30-60 mmHg for 2 hours. Thereafter pyridine (164 g, 2.07 mol) and dimethylchlorosilane (131 g, 1.38 mol) were added thereto, and stirring was conducted at 40° C. for 1 hour. After completion of the reaction, water (1.5 kg) was added for oil-water separation, stirring was conducted at 40° C. for 30 minutes, and the aqueous layer was removed. Similarly, oil-water separation was conducted three times by using water (1.5 kg). The solvent and low molecular components were distilled off from the residual organic layer under a reduced pressure to give intermediate 2-1 (614 g, yield: 65%).

Production Example 3

Synthesis of Intermediate 2-2

Intermediate 2-2 was synthesized in a similar production process to that of the above-mentioned intermediate 2-1, except that 590 g (0.744 mol) of octaphenylcyclotetrasiloxane was used and 410 g (1.382 mol) of octamethylcyclotetrasiloxane was used in the synthesis of the intermediate 2-1.

Production Example 4

Synthesis of Intermediate 2-3

To a 3,000 ml four-necked flask equipped with a stirrer, a thermometer, a nitrogen-sealed tube and a cooling tube were added octaphenylcyclotetrasiloxane (590 g, 0.74 mol), 1,3-divinyl 1,1,3,3-tetramethyldisiloxane (23.7 g, 0.13 mol), potassium hydroxide (216 mg, 3.85 mmol), N-methylpyrrolidone (129 g) and octamethylcyclotetrasiloxane (410 g, 1.38 mol), and stirring was conducted under a nitrogen flow at 70° C. for 3 hours. Thereafter pyridine (18 g, 0.23 mol) and dimethylvinylchlorosilane (18.5 g, 0.15 mol) were added, and stirring was conducted at 70° C. for 1 hour. After the reaction was completed, the reactant was cooled to 40° C., and 670 g of toluene was added. For oil-water separation, water (850 g) was added, stirring was conducted at 40° C. for 30 minutes, and the aqueous layer was removed. Similarly, oil-water separation was conducted three times by using water (850 g). The solvent and low molecular components were distilled off from the residual organic layer under a reduced pressure. Thereafter 1,3,5,7-tetramethylcyclotetrasiloxane (191 g, 0.80 mol), a 0.40% toluene solution of Ossko catalyst (7.30 g) and toluene (560 g) were added, and reflux was conducted under an argon flow for 3 hours. After the reaction was completed, the reactant was cooled to 25° C., and the solvent was distilled off under a reduced pressure. Thereafter 560 g of acetonitrile was added to the product so as to conduct separation operations, and stirring was conducted at 25° C. for 30 minutes. Since the product and acetonitrile were separated into two layers, the acetonitrile layer was removed. Similar separation operations were conducted twice. The solvent and unreacted substances were distilled off from the residual organic layer under a reduced pressure to give intermediate 2-3 (560 g, yield: 52%).

Production Example 5

Synthesis of Intermediate 3-1

To a four-necked flask equipped with a stirrer, a thermometer, a nitrogen-sealed tube and a cooling tube were added octaphenylcyclotetrasiloxane (590 g, 0.74 mol), 1,3-divinyl 1,1,3,3-tetramethyldisiloxane (23.7 g, 0.13 mol), potassium hydroxide (216 mg, 3.85 mmol), N-methylpyrrolidone (129 g) and octamethylcyclotetrasiloxane (880 g, 2.97 mol), and stirring was conducted under a nitrogen flow at 70° C. for 3 hours. Thereafter pyridine (18 g, 0.23 mol) and dimethylvinylchlorosilane (18.5 g, 0.15 mol) were added thereto, and stirring was conducted at 70° C. for 1 hour. After the completion of the reaction, the reactant was cooled to 40° C., and 670 g of toluene was added. Water (850 g) was added for oil-water separation, stirring was conducted at 40° C. for 30 minutes, and the aqueous layer was removed. Similarly, oil-water separation was conducted three times by using water (850 g). The solvent and low molecular components were distilled off from the residual organic layer under a reduced pressure to give intermediate 3-1 (550 g, yield: 53%).

Production Example 6

Synthesis of Intermediate 3-2

Intermediate 3-2 was synthesized in a similar production process to that of the above-mentioned intermediate 3-1, except that 590 g (0.744 mol) of octaphenylcyclotetrasiloxane was used and 410 g (1.382 mol) of octamethylcyclotetrasiloxane was used in the synthesis of the intermediate 3-1.

Example 1-1

Synthesis of Compound No. 1

To a 500 ml four-necked flask equipped with a stirrer, a thermometer and an argon introduction tube were added the intermediate 2-1 (100 g, SiH group: 23.8 mmol), the intermediate 1 (10.5 g, 71.4 mmol), a 0.25% solution of Ossko catalyst in toluene (2.0 g), hydroquinone (1.02 g, 9.26 mmol) and toluene (50.0 g), and stirring was conducted under an argon atmosphere at from 100 to 110° C. for 2 hours. After the reaction was completed, the reactant was cooled to 25° C., a 1% aqueous sodium hydrogen carbonate solution (100 g) was added for oil-water separation, stirring was conducted at 25° C. for 30 minutes, and the aqueous layer was removed. Similarly, operations of oil-water separation were conducted six times by using a 1% aqueous sodium hydrogen carbonate solution, and oil-water separation was conducted three times by using water (100 g). The solvent and unreacted substances were distilled off from the residual organic layer under a reduced pressure to give compound No. 1 (37.9 g, yield: 72%).

The obtained compound No. 1 was analyzed, and it was confirmed as the result thereof that the compound had the general formula (4) wherein $R^1$, $R^2$, $R^7$ and $R^8$=methyl groups, $R^9$ and $R^{10}$=phenyl groups, $X^1$=the general formula (2), $L^1$=a propylene group, and $R^5$=a methyl group. The result of the analysis is shown in the following.

(Result of analysis) Chemical shifts of $^1$H-NMR (CDCl$_3$: 25° C.) (ppm) −0.35-0.51 (m: 6 mH), 0.94 (d: 6H), 1.09 (s: 6H), 1.23-1.32 (m: 2H), 1.52 (brs: 2H), 1.77 (brs: 2H), 2.17 (s: 3H), 3.08-3.52 (m: 3H), 6.89-7.74 (m: 10nH).

In addition, in the above-mentioned result of the analysis, 6 mH corresponds to the methyl groups of $R^7$ and $R^8$ in the general formula (4), and 10 nH corresponds to the phenyl groups of $R^9$ and $R^{10}$ in the general formula (4).

Furthermore, according to the $^1$H-NMR analysis, the ratio m/n was 8/2 for m and n in the general formula (4).

Example 1-2

Synthesis of Compound No. 2

To a 500 ml four-necked flask equipped with a stirrer, a thermometer and an argon introduction tube were added the intermediate 2-2 (50.0 g, SiH group: 15.5 mmol), the intermediate 1 (10.5 g, 46.8 mmol), a 0.25% toluene solution of Ossko catalyst (1.00 g), hydroquinone (528 mg, 4.80 mmol) and toluene (24.0 g), and stirring was conducted under an argon atmosphere at from 100 to 110° C. for 2 hours. After the reaction was completed, the solvent was distilled off under a reduced pressure. The product was cooled to 25° C., 50 g of acetonitrile was added to the product for conducting separation operations, and stirring was conducted at 25° C. for 30 minutes. Since the product and acetonitrile were separated into two layers, the acetonitrile layer was removed, and similar separation operations were conducted three times. The solvent and unreacted substances were distilled off from the residual organic layer under a reduced pressure to give compound No. 2 (39.6 g, yield: 74%).

As the result of the analysis of the obtained compound No. 2, it was confirmed that the compound had the general formula (4) wherein $R^1$, $R^2$, $R^7$ and $R^8$=methyl groups, $R^9$ and $R^{10}$=phenyl groups, $X^1$=the general formula (2), $L^1$=a propylene group and $R^5$=a methyl group. The result of the analysis is shown in the following.

(Result of analysis) Chemical shifts of $^1$H-NMR (CDCl$_3$: 25° C.) (ppm) −0.44-0.55 (m: 6 mH), 0.97 (d: 6H), 1.12 (d: 6H), 1.26-1.35 (m: 2H), 1.51 (brs: 2H), 1.76-1.82 (m: 2H), 2.20 (s: 3H), 3.12-3.53 (m: 3H), 6.86-7.61 (m: 10 nH).

In addition, in the above-mentioned result of the analysis, 6 mH corresponds to the methyl groups of $R^7$ and $R^8$ in the general formula (4), and 10 nH corresponds to the phenyl groups of $R^9$ and $R^{10}$ in the general formula (4).

Furthermore, according to the $^1$H-NMR analysis, the ratio m/n was 7/3 for m and n in the general formula (4).

Example 1-3

Synthesis of Compound No. 3

To a 500 ml four-necked flask equipped with a stirrer, a thermometer and an argon introduction tube were added the intermediate 2-3 (10.0 g, SiH group: 15.5 mmol), the intermediate 1 (10.3 g, 46 6 mmol), hydroquinone (100 mg, 0.90 mmol) and toluene (5.0 g), and stirring was conducted under an argon atmosphere at from 100-110° C. for 11 hours. After the reaction was completed, the solvent was distilled off under a reduced pressure. The product was cooled to 25° C., 50 g of acetonitrile was added to the product for conducting separation operations, and stirring was conducted at 25° C. for 30 minutes. Since the product and acetonitrile were separated into two layers, the acetonitrile layer was removed, and similar separation operations were conducted three times. The solvent and unreacted substances were distilled off from the residual organic layer under a reduced pressure to give compound No. 3 (10.5 g, yield: 78%).

As the result of the analysis of the obtained compound No. 3, it was confirmed that the compound had the general formula (4) wherein $R^1$, $R^2$, $R^7$ and $R^8$=methyl groups, $R^9$ and $R^{10}$=phenyl groups, $X^1$=the general formula (3), $X^2$=a mixture of the general formula (2)/hydrogen atoms=8/2 (molar ratio), $L^1$=a propylene group, $L^2$=an ethylene group, s=3, and $R^5$ and $R^6$=methyl groups. The result of the analysis is shown in the following.

(Result of analysis) Chemical shifts of $^1$H-NMR (CDCl$_3$: 25° C.) (ppm) –0.35-0.51 (m: 6 mH+18H), 0.99 (s: 6H), 1.13 (s: 6H), 1.29-1.35 (t: 2H), 1.56 (brs: 2H), 1.81-1.84 (m: 2H), 2.20 (s: 3H), 3.35-3.47 (m: 3H), 6.87-7.61 (m: 10nH).

In addition, in the above-mentioned result of the analysis, 6 mH corresponds to the methyl groups of $R^7$ and $R^8$ in the general formula (4), and 10 nH corresponds to the phenyl groups of $R^9$ and $R^{10}$ in the general formula (4).

Furthermore, according to the $^1$H-NMR analysis, the ratio m/n was 7/3 for m and n in the general formula (4).

The average molecular weight and viscosity were measured according to the following methods for each of the compounds Nos. 1 to 3 obtained in the above-mentioned Examples 1-1 to 1-3. The results thereof are shown in Table 1. In addition, the ratio m/n is also described in Table 1 for the purpose of reference.

<Measurement of Average Molecular Weight>

The mass average molecular weight (Mw) and number average molecular weight (Mn) were analyzed by GPC under the following conditions.

Apparatus: HLC-8320 GPC manufactured by Tosoh Corporation

Column: TSKgel SuperMultiporeHZ-MX2, TSKguardcolumn SuperMP(HZ)-M manufactured by Tosoh Corporation Mobile phase: tetrahydrofuran
Standard substance: polystyrene
Temperature: 40° C.
Flux: 0.35 mL/min
Detection: differential refractive index detector <Measurement of Viscosity>

The viscosity at 25° C. (mPa·s) was measured by a type TV-22 viscometer manufactured by Toki Sangyo Co., Ltd.

TABLE 1

|  | Compound No. 1 | Compound No. 2 | Compound No. 3 |
|---|---|---|---|
| Viscosity (mPa · s) | 1316 | 7500 | 9500 |
| Mw/Mn | 10500 | 11500/6600 | 18400/7330 |
| m/n | 8/2 | 7/3 | 7/3 |

Furthermore, for the intermediate 3-1 and intermediate 3-2 obtained in Production Examples 5 and 6, respectively, the average molecular weights were measured in a similar manner to that for the compounds Nos. 1 to 3.

Furthermore, an $^1$H-NMR analysis was conducted on the intermediate 3-1 and intermediate 3-2 to obtain the ratio of m' that is the number of the repeating unit represented by —[SiCH$_3$CH$_3$—O]— and n' that is the number of the repeating unit represented by —[SiC$_6$H$_5$C$_6$H$_5$—O]— included in the respective intermediates, m'/n'.

The results thereof are shown in Table 2.

TABLE 2

|  | Intermediate 3-1 | Intermediate 3-2 |
|---|---|---|
| Mw/Mn | 11100/5800 | 7870/4060 |
| m'/n' | 8/2 | 7/3 |
| Si-vinyl group equivalent (mmol/g) | 0.286 | 0.290 |

Examples 2-1 to 2-15, and Comparative Examples 1-1 to 1-8

Production of Resin Compositions

Using the following test compounds, resin compositions were prepared by the compositions described in Table 3 and Table 4. Each resin composition was weighed and put into a crucible (volume: 10 mL, outer diameter: 32 mm, height: 24 mm) so that the total became 3.7 g, and heated for 2 hours at 150° C. By this heating, the polymerization of the polysiloxane compound included in the following X-1, X-2 and X-3 as resins proceeds, thereby the resin compositions are cured.

Test Compounds

<Components A: Compounds of Present Invention and Comparative Compounds>

A-1: compound No. 1 (the general formula (4) wherein $R^1$, $R^2$, $R^7$ and $R^8$=methyl groups, $R^9$ and $R^{19}$=phenyl groups, $X^1$=the general formula (2), $L^1$=a propylene group, $R^5$=a methyl group, and m/n=8/2)

A-2: compound No. 2 (the general formula (4) wherein $R^1$, $R^2$, $R^7$ and $R^8$=methyl groups, $R^9$ and $R^{10}$=phenyl groups, $X^1$=the general formula (2), $L^1$=a propylene group, $R^5$=a methyl group, and m/n=7/3)

A-3: compound No. 3 (the general formula (4) wherein $R^1$, $R^2$, $R^7$ and $R^8$=methyl groups, $R^9$ and $R^{10}$=phenyl groups, $X^1$=the general formula (3), $X^2$=a mixture of the general formula (2)/hydrogen atom=8/2 (molar ratio), $L^1$=a propylene group, $L^2$=an ethylene group, s=3, $R^5$ and $R^6$=methyl groups, and m/n=7/3)

a-1: a mixed esterified product of 1,2,3,4-butanetetracarboxylic acid, 1,2,2,6,6-pentamethyl-4-piperidinol and 3,9-bis(2-hydroxy-1,1-dimethylethyl)-2,4,8,10-tetraoxaspiro [5.5]undecane (manufactured by ADEKA CORPORATION, product name: ADEKASTAB LA-63P)

a-2: a mixed esterified product of 1,2,3,4-butanetetracarboxylic acid, 2,2,6,6-tetramethyl-4-piperidinol and 3,9-bis (2-hydroxy-1,1-dimethylethyl)-2,4,8,10-tetraoxaspiro[5.5] undecane (manufactured by ADEKA CORPORATION, product name: ADEKASTAB LA-68)

a-3: a (tetramethylpiperidinyl)oxypropylmethylsiloxanedimethylsiloxane copolymer (manufactured by Gelest, Inc., product name: UBS-0822)

<Components B: Inorganic Powder Bodies>

B-1: fumed titanium dioxide (manufactured by Nippon Aerosil Co., Ltd., product name: AEROXIDE TiO$_2$ T805)

B-2: fumed titanium dioxide (manufactured by Nippon Aerosil Co., Ltd., product name: AEROXIDE TiO$_2$ P25)

B-3: anatase type titanium dioxide (manufactured by Ishihara Sangyo Kaisha Ltd., product name: MS-50)

B-4: rutile type titanium dioxide (manufactured by Ishihara Sangyo Kaisha Ltd, product name: TTO-SS (A))

B-5: brookite type titanium dioxide (manufactured by Kojundo Chemical Laboratory Co., Ltd.)

B-6: zinc oxide (manufactured by Ishihara Sangyo Kaisha Ltd., product name: FZO-50)

B-7: fumed aluminum oxide (manufactured by Nippon Aerosil Co., Ltd., product name: AEROXIDE Alu C805)

<Components X: Resins>

X-1: The intermediate 3-1, the intermediate 2-1 and tetramethylcyclotetrasiloxane were put into a flask so that they became 10 g in total at the ratio of intermediate 3-1/intermediate 2-1/tetramethylcyclotetrasiloxane=46.3/53.6/0.1 (mass ratio), respectively, 80 ppm of an Ossko catalyst was put into the flask, and stirring was conducted at 25° C. so as to be homogeneous.

X-2: The intermediate 3-2, the intermediate 2-2 and tetramethylcyclotetrasiloxane were put into a flask so that they became 10 g in total at the ratio of intermediate 3-2/intermediate 2-2/tetramethylcyclotetrasiloxane=60.0/39.5/0.5 (mass ratio), respectively, 80 ppm of an Ossko catalyst was put into the flask, and stirring was conducted at 25° C. so as to be homogeneous.

X-3: the intermediate 2-3 (The intermediate 2-3 was a polysiloxane represented by the general formula (X-a), and in the general formula (X-a), $R^a=R^b=R^c=R^d=$a methyl group, $R^e=R^f=R^g=$a phenyl group, Z=a hydrogen atom, $L^3=$an ethylene group, k=3, rq=3:7, p=2, the mass average molecular weight Mw=15,000, and the number average molecular weight Mn=7,900.)

<Measurement of Residual Ratio and Consistency>

For each of the obtained cured products of the resin compositions, the residual ratio and consistency were measured by the following methods. The results thereof are shown in Table 3 and Table 4.

(Measurement of Residual Ratio)

The cured product of the resin composition was stored in an oven at 250° C. in the air. At after 100 hours and 200 hours had passed since the initiation of the storage test, the respective masses of the cured product of the resin composition were measured and compared with the mass before the initiation of the test, and the residual ratio <Calculation formula: 100−[(mass before test-mass after 100 hours or 200 hours have passed)/mass before test×100]> was obtained.

(Measurement of Consistency)

The cured product of the resin composition was stored in an oven at 250° C. in the air. At before the initiation of the storage test, and at after 100 hours and 200 hours had passed since the initiation of the storage test, the respective consistencies were measured for the cured product of the resin composition under the following measurement condition.

Measurement Condition

According to the test method of JIS K2220-2003, the consistency was measured by using a ¼ circular cone for consistency measurement (Rigo Co., Ltd.: Type 874) and an automatic consistency meter (RPM-101 manufactured by Rigo Co., Ltd.). The consistency of a resin composition decreases as the resin composition is deteriorated by oxidation.

TABLE 3

| | | Examples | | | | | | | | | | | | | | |
|---|---|---|---|---|---|---|---|---|---|---|---|---|---|---|---|---|
| | | 2-1 | 2-2 | 2-3 | 2-4 | 2-5 | 2-6 | 2-7 | 2-8 | 2-9 | 2-10 | 2-11 | 2-12 | 2-13 | 2-14 | 2-15 |
| Formulation (parts) | X-1 | 100 | | | | 100 | 100 | | 100 | 100 | 100 | 100 | 100 | | | |
| | X-2 | | 100 | 100 | 100 | | | 100 | | | | | | | | |
| | X-3 | | | | | | | | | | | | | 100 | 100 | 100 |
| | A-1 | | 1.5 | | | 1.5 | 1.5 | | 1.5 | 1.5 | 1.5 | 1.5 | 1.5 | 1.5 | 1.5 | |
| | A-2 | | | 0.5 | 1.5 | | | 1.5 | | | | | | | | 1.5 |
| | A-3 | | | | 1 | | | | | | | | | | | |
| | a-1 | | | | | | | | | | | | | | | |
| | a-2 | | | | | | | | | | | | | | | |
| | a-3 | | | | | | | | | | | | | | | |
| | B-1 | | | | | 5 | | 5 | | | | | | | 5 | |
| | B-2 | | | | | | 5 | | | | | | | | | |
| | B-3 | | | | | | | | 5 | | | | | | | |
| | B-4 | | | | | | | | | 5 | | | | | | |
| | B-5 | | | | | | | | | | 5 | | | | | |
| | B-6 | | | | | | | | | | | 5 | | | | |
| | B-7 | | | | | | | | | | | | 5 | | | |
| Results | Consistency (1/10 mm) | 0 | 57 | 50 | 60 | 59 | 66 | 77 | 69 | 72 | 66 | 75 | 76 | 48 | 59 | 64 | 62 |
| | | 100 h | 50 | 25 | 50 | 37 | 66 | 68 | 64 | 62 | 65 | 73 | 64 | 27 | 54 | 63 | 54 |
| | | 200 h | 16 | 8 | 20 | 14 | 58 | 53 | 50 | 25 | 28 | 33 | 24 | 19 | 17 | 59 | 16 |
| | Residual Ratio (%) | 100 h | 98.6 | 98.6 | 98.7 | 99.0 | 99.3 | 99.5 | 99.2 | 99.2 | 99.2 | 99.5 | 99.1 | 98.7 | 99.1 | 99.4 | 99.2 |
| | | 200 h | 97.2 | 97.2 | 97.5 | 98.0 | 98.6 | 98.9 | 98.4 | 97.9 | 97.8 | 98.0 | 97.1 | 97.2 | 98.1 | 99.2 | 98.0 |

TABLE 4

| | | Comparative Examples | | | | | | | |
|---|---|---|---|---|---|---|---|---|---|
| | | 1-1 | 1-2 | 1-3 | 1-4 | 1-5 | 1-6 | 1-7 | 1-8 |
| Formulation (parts) | X-1 | 100 | | 100 | 100 | 100 | | | |
| | X-2 | | 100 | | | | 100 | 100 | |
| | X-3 | | | | | | | | 100 |
| | A-1 | | | | | | | | |
| | A-2 | | | | | | | | |
| | A-3 | | | | | | | | |

TABLE 4-continued

| | | | Comparative Examples | | | | | | | |
|---|---|---|---|---|---|---|---|---|---|---|
| | | | 1-1 | 1-2 | 1-3 | 1-4 | 1-5 | 1-6 | 1-7 | 1-8 |
| | a-1 | | | | 0.1 | | | | | |
| | a-2 | | | | | 0.1 | | | | |
| | a-3 | | | | | | 1.5 | | | |
| | B-1 | | | | | | | 5 | | |
| | B-2 | | | | | | | | 5 | |
| | B-3 | | | | | | | | | |
| | B-4 | | | | | | | | | |
| | B-5 | | | | | | | | | |
| | B-6 | | | | | | | | | |
| | B-7 | | | | | | | | | |
| Results | Consistency | 0 h | 55 | 52 | 54 | 54 | 55 | 59 | 60 | 56 |
| | (1/10 mm) | 100 h | 8 | 7 | 10 | 10 | 17 | 20 | 20 | 16 |
| | | 200 h | 5 | 5 | 2 | 3 | 14 | 8 | 12 | 9 |
| | Residual | 100 h | 97.0 | 96.7 | 96.9 | 96.4 | 98.0 | 98.1 | 98.4 | 97.6 |
| | Ratio (%) | 200 h | 95.1 | 95.3 | 94.9 | 94.0 | 95.5 | 96.2 | 96.1 | 96.6 |

When Examples 2-1 to 2-15 and Comparative Examples 1-1 to 1-8 are compared, it is found that decrease in the consistency and decrease in the weight are mild and the thermal stability has been improved in the resin compositions to which the compound of the present invention has been added. Furthermore, from Examples 2-5 to 2-12, it is found that the thermal stability is further improved by using the inorganic powder body in combination with the compound of the present invention.

Meanwhile, in Comparative Examples 3-3 and 3-4, since the compounds a-1 and a-2 do not solve homogeneously in the resin when added by 0.2 part by mass or more, the tests were conducted by the contents described in the above-mentioned Table 4.

The invention claimed is:

1. A compound represented by formula (1):

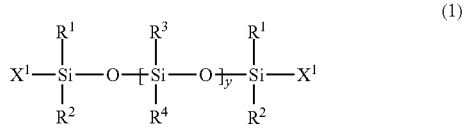

(1)

wherein $R^1$ to $R^4$ each independently represent a straight chain or branched alkyl group having 1 to 12 carbon atoms or an aryl group having 6 to 12 carbon atoms,
y represents a number from 1 to 2,000, and
$X^1$ represents a group represented by formula (2) or a group represented by formula (3),

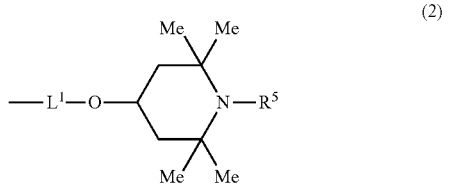

(2)

wherein $R^5$ represents a hydrogen atom, O·, a straight chain or branched alkyl group having 1 to 12 carbon atoms or a straight chain or branched alkoxy group having 1 to 12 carbon atoms, $L^1$ represents a straight chain or branched alkylene group having 1 to 6 carbon atoms or an arylene group having 6 to 12 carbon atoms, and O· represents an oxyradical, (3)

wherein $R^6$ represents an alkyl group having 1 to 4 carbon atoms or an aryl group having 6 to 12 carbon atoms, $X^2$ represents a group represented by the formula (2) or a hydrogen atom, s represents a number of 2 to 6, $L^2$ represents a straight chain or branched alkylene group having 1 to 6 carbon atoms or an arylene group having 6 to 12 carbon atoms, provided that at least one of s number of $X^2$s is a group represented by the formula (2).

2. The compound according to claim 1, represented by formula (4):

(4)

wherein $R^7$ and $R^8$ each independently represent a straight chain or branched alkyl group having 1 to 12 carbon atoms,
$R^9$ and $R^{10}$ each independently represent an aryl group having 6 to 12 carbon atoms,
m and n represent numbers such that m +n is from 1 to 2,000, and
$R^1$, $R^2$ and $X^1$ are as defined in formula (1).

3. A resin composition, containing the compound according to claim 1 in an amount from 0.001 to 10 parts by mass with respect to 100 parts by mass of the resin.

4. The resin composition according to claim 3, containing an inorganic powder body in an amount from 0.001 to 20 parts by mass with respect to 100 parts by mass of the resin.

5. The resin composition according to claim 4, wherein the inorganic powder body is at least one of titanium dioxide, zinc oxide or aluminum oxide.

6. The resin composition according to claim 3, wherein the resin is a polysiloxane.

7. The resin composition according to claim 6, wherein the polysiloxane is represented by formula (X):

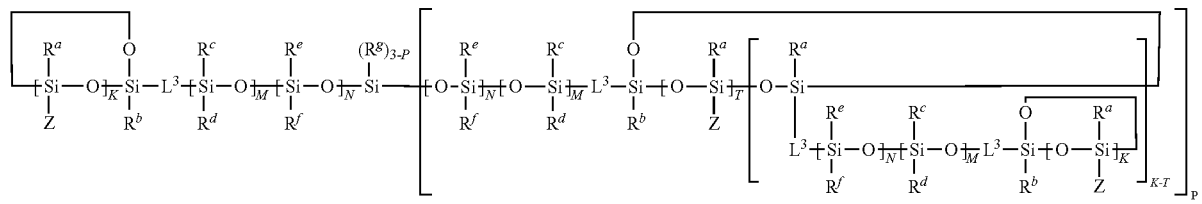

(X)

wherein $R^a$ to $R^g$ may be the same or different, and each independently represent a straight chain or branched alkyl group having 1 to 12 carbon atoms or an aryl group having 6 to 12 carbon atoms, provided that $R^e$ and $R^f$ do not simultaneously represent straight chain or branched alkyl groups having 1 to 12 carbon atoms, $L^3$ is an alkylene group having 2 to 4 carbon atoms, Z is a hydrogen atom or an alkenyl group or alkynyl group having 2 to 4 carbon atoms, K is a number of from 2 to 7, T is a number of from 1 to 7, and P is a number of from 0 to 3;

M and N are such numbers that the ratio M:N =1:1 to 1:100 and the total of all Ms and all Ns is 15 or more, and also such numbers that the mass average molecular weight of the polysiloxane is from 3000 to 1,000,000.

8. A cured product that is obtained by curing the resin composition according to claim 3.

9. A sealant or adhesive for a semiconductor device, comprising the resin composition according to claim 3.

10. A semiconductor device, comprising a cured product that is obtained by curing the resin composition according to claim 8.

11. A resin composition containing the compound according to claim 2 in an amount from 0.001 to 10 parts by mass with respect to 100 parts by mass of the resin.

12. The resin composition according to claim 4, wherein the resin is a polysiloxane.

13. The resin composition according to claim 5, wherein the resin is a polysiloxane.

14. A cured product that is obtained by curing the resin composition according to claim 4.

15. A cured product that is obtained by curing the resin composition according to claim 6.

16. A cured product that is obtained by curing the resin composition according to claim 7.

17. A sealant or adhesive for a semiconductor device, comprising the resin composition according to claim 4.

18. A sealant or adhesive for a semiconductor device, comprising the resin composition according to claim 5.

19. A sealant or adhesive for a semiconductor device, comprising the resin composition according to claim 6.

\* \* \* \* \*